United States Patent [19]
Inaba

[11] Patent Number: 5,057,836
[45] Date of Patent: Oct. 15, 1991

[54] DATA INPUT APPARATUS HAVING A MICROCOMPUTER

[75] Inventor: Hitoshi Inaba, Fukaya, Japan

[73] Assignee: Kabushiki Kaisha Toshiba, Kawasaki, Japan

[21] Appl. No.: 565,889

[22] Filed: Aug. 10, 1990

Related U.S. Application Data

[63] Continuation of Ser. No. 298,750, Jan. 19, 1989, abandoned.

[30] Foreign Application Priority Data

Jan. 22, 1988 [JP] Japan ................................. 63-12008

[51] Int. Cl.$^5$ ........................................ H03M 11/20
[52] U.S. Cl. ........................................ 341/26; 341/22
[58] Field of Search ............... 341/22, 24, 25, 26, 341/33; 178/17 C; 379/368; 400/472, 477, 479, 479.1; 364/709.12

[56] References Cited

U.S. PATENT DOCUMENTS

| | | | |
|---|---|---|---|
| 4,429,301 | 1/1984 | Crumley et al. | 341/22 |
| 4,470,037 | 9/1984 | Takahashi | 341/22 |
| 4,555,693 | 11/1985 | Danish et al. | 340/365 |
| 4,561,002 | 12/1985 | Chiu | 341/26 |
| 4,591,833 | 5/1986 | Ishii et al. | 341/26 |
| 4,725,816 | 2/1988 | Petterson | 341/26 |
| 4,737,768 | 4/1988 | Lewiner et al. | 341/33 |
| 4,862,166 | 8/1989 | Yamakawa | 341/33 |
| 4,872,008 | 10/1989 | Ohtsuka et al. | 341/22 |

FOREIGN PATENT DOCUMENTS

| | | | |
|---|---|---|---|
| 3340749 | 11/1983 | Fed. Rep. of Germany . | |
| 35226 | 2/1984 | Japan | 341/26 |
| 154533 | 9/1984 | Japan | 341/26 |

OTHER PUBLICATIONS

Halbleiter-Schaltungstechnik, Springer-Verlag Berlin Heidelberg, New York 1978, pp. 568-575.

*Primary Examiner*—Donald J. Yusko
*Assistant Examiner*—Michael Horabik
*Attorney, Agent, or Firm*—Cushman, Darby & Cushman

[57] ABSTRACT

A data input apparatus having a first group of lines extending parallel to one another, and a second group of lines extending parallel to one another and intersecting with the lines of the first group at right angles. The apparatus also has groups of key switches located at the intersections of the lines of the first group and the lines of the second group. The lines of the first group are connected to the output ports of a microcomputer. Low-Level pulses are periodically supplied to these lines at different times. The apparatus further comprises a serial circuit including a group of first resistors each connected between adjacent lines of the second group. A voltage source is connected at a connecting point to one end of this serial circuit through a second resistor. The connecting point of the serial circuit and the second resistor is coupled to the input port of the microcomputer. The microcomputer determines which key switch has been operated, in accordance with the voltage applied to the input port at the time a low-level pulse is supplied to the corresponding line of said first group.

7 Claims, 7 Drawing Sheets

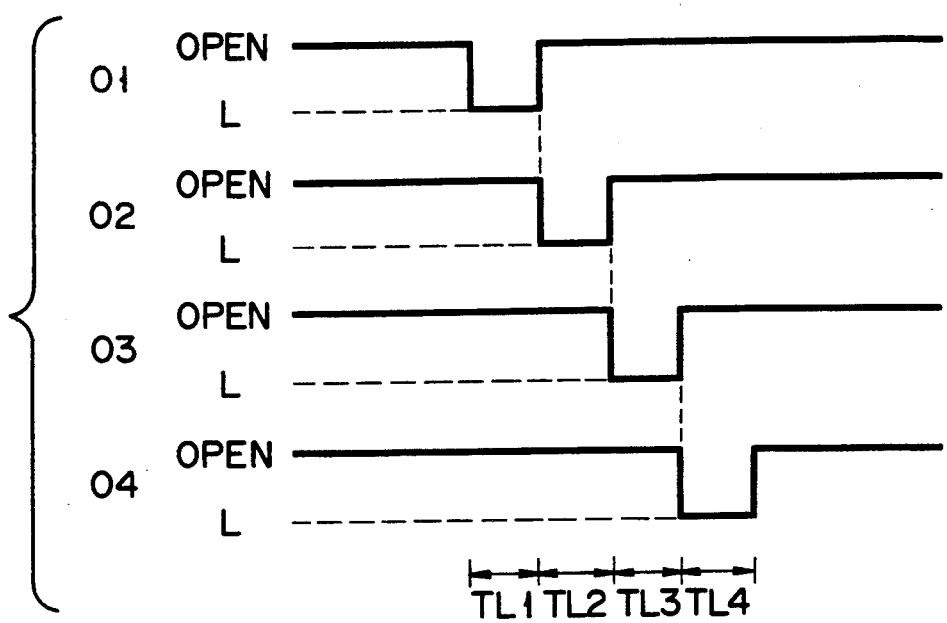
F I G. 2
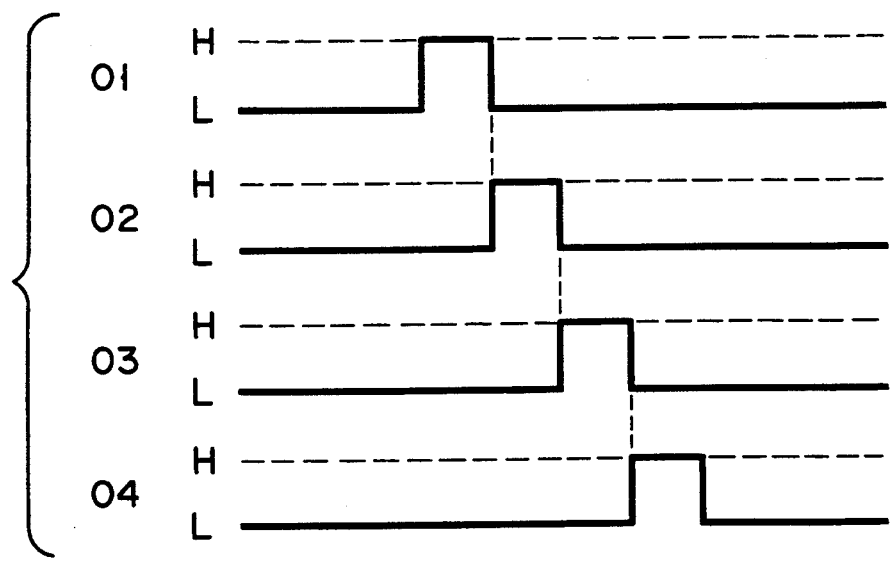
F I G. 6

DATA INPUT APPARATUS HAVING A MICROCOMPUTER

This is a continuation of application Ser. No. 298,750, filed on Jan. 19, 1989, which was abandoned upon the filing hereof.

BACKGROUND OF THE INVENTION

1. Field of the Invention

The present invention relates to a data input apparatus which is simple in structure and has a key matrix and means capable of easily detecting which keys of the key matrix have been operated.

2. Description of the Related Art

As is known in the art, electronic apparatuses such as TV receivers and video tape recorders comprise a data input apparatus which has a key matrix and a microcomputer designed to detect which keys of a key matrix have been operated.

The key matrix comprises N lines of a first group, M lines of a second group, and M×N key switches. The lines of the first group extend parallel to one another. The lines of the second group extend parallel to one another, and intersect at right angles with the lines of the first group. The key switches are located at the intersections of the lines of the first group and the lines of the second group. The microcomputer has M input ports and N output ports are connected to the lines of the first group, and the M input ports are connected to the lines of the second group. The microcomputer outputs, at the output ports, drive signals which are normally at a high level and periodically at a low level. The microcomputer is designed to output one low-level signal at a time to the output parts. In other words, it outputs a sequence of low-level signals from the output ports to N lines of the first group. The periodic low-level signals are output to each of the N lines, but only one of the N lines is a low-level at any time.

The microcomputer outputs a sequence of low-level drive signals to the first group of lines. If any one of the key switches is turned on, the microcomputer receives a low-level input signal at ,the input port connected to of the second group of lines (which are also coupled to the key switch). Therefore, the microcomputer can determine which key switch has been turned on by detecting which input port receives a low-level input signal in light of which output port supplied a low-level signal.

To determine which key switch has been turned on, the microcomputer needs to have M+N ports, i.e., M input ports and N output ports. The more ports a microcomputer has, the more difficult it is to manufacture the microcomputer in the form of an LSI circuit. Generally, a microcomputer requires $2\sqrt{K}$ or more ports when used in combination with a key matrix having K key switches.

A data input apparatus is known which has a microcomputer having only one input port and N output ports. This microcomputer can, therefore, be readily made in the form of an LSI circuit. It is combined with a key matrix, thus forming a data input apparatus. The key matrix comprises N lines of a first group, extending parallel to one another, and M lines of a second group, extending parallel to one another and intersecting with the lines of the first group at right angles, and key switches located at the intersections of the lines of the first group and lines of the second group. The N lines of the first group are connected to the N output ports of the microcomputer. Each key switch is connected, at one end, to one line of the first group. Resistors are provided on each line of the first group, and located between the connecting points of the line and the key switches. Each M lines of the second group is connected to the sole input port of the microcomputer and to one end of a resistor, the resistors are coupled at the other end to a constant-voltage terminal. A DC voltage is applied to this terminal.

The output ports of the microcomputer are usually open. The microcomputer is designed to output low-level signals sequentially, not simultaneously, through the output ports. In other words, the low-level signals are supplied to the lines of the first group, one after another. Further, the microcomputer can convert the voltage, which has been applied to the input port, into digital data representing this voltage.

A low-level signal is sequentially output from the output ports of the microcomputer. If any of the key switches is turned on, a unique voltage identifying the key switch is applied to the input port of the microcomputer at the same time The microcomputer can therefore determine which key switch has been turned on, in accordance with the level of the input voltage at the time of outputting a low-level signal.

This data input apparatus is advantageous in that the microcomputer requires only one input port. The number J of all ports which the microcomputer must have in this case is given:

$$J = 1 + \{K/(I+1)\}$$

where K is the number of key switches of the key matrix, and I is the number of resistors connected on a single line of the first group.

When the key matrix has 32 key switches, seven resistors are connected on the line of the first group. Hence, the number J of ports required is:

$$J = 1 + \{32/(7+1)\} = 5$$

That is, the microcomputer requires one input port and four output ports in this instance.

Although the microcomputer has less ports, it requires more resistors than in the conventional data input apparatus. Consequently, this data input apparatus is, after all, as complex as the conventional one.

Generally, data input apparatuses of this type require more than H resistors, H being given:

$$H = I\{L/(I+1)\} + 1$$

For example, when the key matrix of the apparatus has 32 key switches, seven resistors must be connected on the line of the first group. Hence, the number H of resistors is:

$$H = 7\{32/(7+1)\} + 1 = 29$$

As can be understood above, the conventional data input apparatus must be provided with a microcomputer which has many ports. To reduce the required number of ports which the microcomputer needs, the microcomputer must have more resistors.

SUMMARY OF THE INVENTION

The object of the present invention is to provide a data input apparatus having a microcomputer which requires only a small number of ports and also a small number of resistors, and is therefore simple in structure.

According to the present invention, there is provided a data input apparatus comprising a first group of lines extending parallel to one another, a second group of lines extending parallel to one another and intersecting with the lines of the first group at right angles, a plurality of key switches for connecting the lines of the first group to the lines of the second group, each of said key switches being located at a respective intersection of a line of the first group and a line of the second group, pulse-supplying means for supplying a periodic pulse to each line of said first group, the pulses supplied to different lines at different times, a serial circuit comprised of a plurality of first resistors connected in series, each of said first resistors connected in parallel between adjacent lines of the second group, a second resistor, and a constant-voltage source connected through said second resistor to one end of said serial circuit by means of a connecting point, and detector means coupled to said pulse-supplying means and to the connecting point for detecting a potential at the connecting point and, in accordance with said potential and with the times at which pulses have been supplied to the lines of said first group from said pulse supplying means, for determining which key switch has been operated.

BRIEF DESCRIPTION OF THE DRAWINGS

FIG. 2 is a timing chart illustrating when the output ports of the microcomputer incorporated in the apparatus shown in FIG. 1 output low-level signals;

FIG. 6 is a timing chart illustrating when the output ports of the microcomputer incorporated in the apparatus shown in FIG. 5 output high-level signals.

DETAILED DESCRIPTION OF THE PREFERRED EMBODIMENTS

Figure 1:
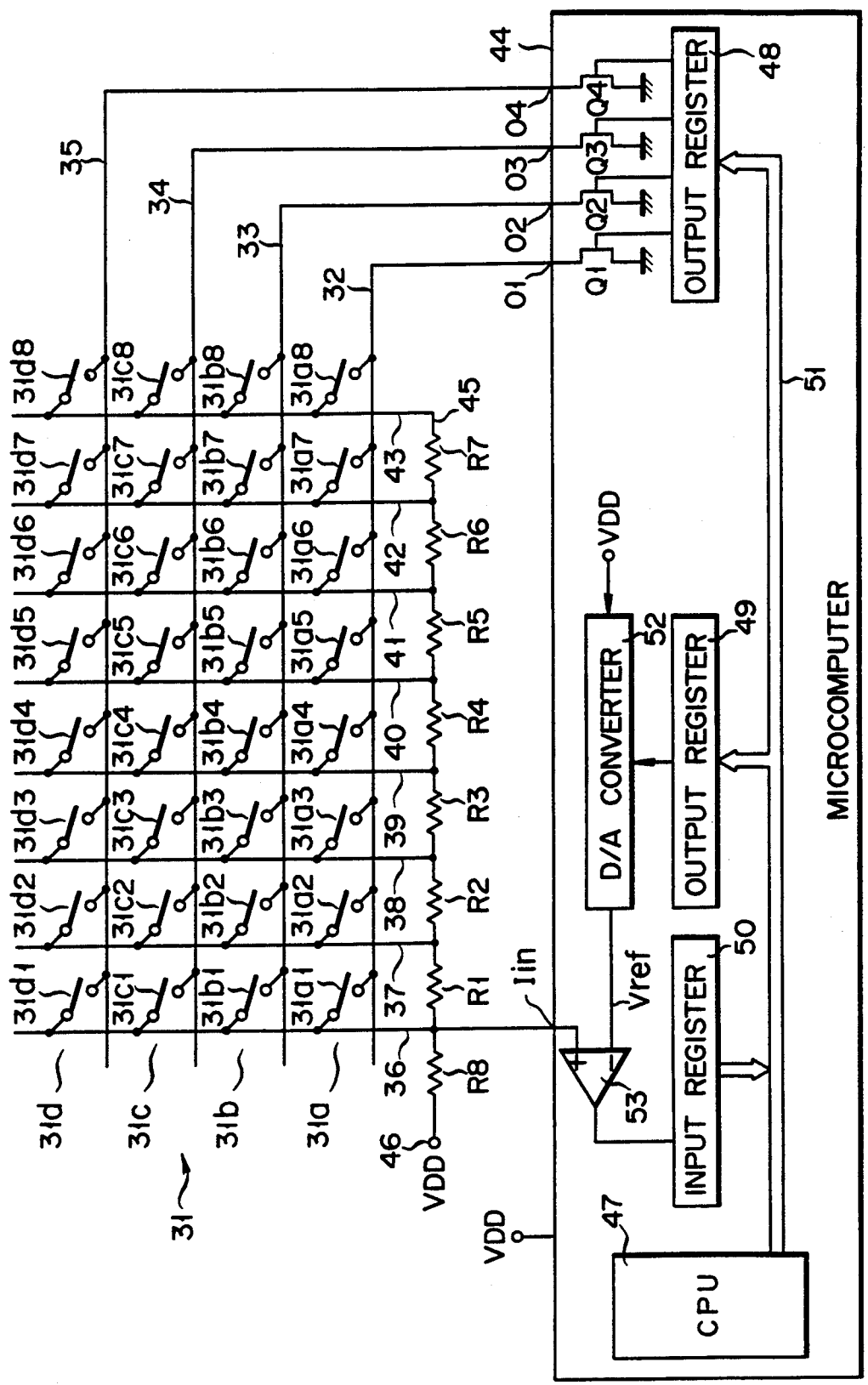
FIG. 1 is a circuit diagram showing the data input apparatus according to a first embodiment of the present invention.

FIG. 1 shows a first embodiment of the present invention, i.e., a data input apparatus which comprises key-matrix circuit 31 and microcomputer 44. Key-matrix circuit 31 has 32 key switches, or four groups of key switches 31a to 31d, each including eight key switches. More specifically, first group 31a has key switches 31a1 to 31a8; second group 31b has key switches 31b1 to 31b8; third group 31c has key switches 31c1 to 31c8; and fourth group 31d has key switches 31d1 to 31d8.

Key-matrix circuit 31 also has two groups of lines, i.e., the first group including four lines 32 to 35, and the second group including eight lines 36 to 43. Lines 32 to 35 of the first group extend parallel to one another. Lines 36 to 43 of the second group also extend parallel to one another, and intersect with lines 32 to 35 at right angles. Key switches 31a1 to 31a8, 31b1 to 31b8, 31c1 to 31c8, and 31d1 to 31d8 are arranged at the intersections of lines 32 to 35 of the first group and lines 36 to 43 of the second group. To be more precise, key switches 31a1 to 31a8 of first group 31a are connected at one end to line 32, and at the other end to lines 36 to 43, respectively. Similarly, key switches 31b1 to 31b8 of second group 31b are connected at one end to line 33, and at the other end to lines 36 to 43, respectively; key switches 31c1 to 31c8 of third group 31c are coupled at one end to line 34, and at the other end to lines 36 to 43, respectively; key switches 31d1 to 31d8 of fourth group 31d are coupled at one end to line 35, and at the other end to lines 36 to 43, respectively.

Microcomputer 44 has four output ports 01 to 04 and one input port Iin. Lines 32 to 35 of the first group are connected to output ports 01 to 04, respectively. Resistors R1 to R7 are each connected between adjacent lines 36 to 43 of the second group, thus forming a serial circuit 45. One end of this serial circuit 45 is connected to a connecting point. Constant-voltage terminal 46 and line 36 of the second group are also connected to the connecting point through resistor R8. The connecting point of line 36 of, the second group, resistor R1, and resistor R8 is further coupled to the input port Iin of microcomputer 44.

Microcomputer 44 comprises CPU 47, two output registers 48, 49, input register 50, internal bus 51, four FETs Q1 to Q4, digital/analog (D/A) converter 52, and comparator 53. CPU 47 is connected by internal bus 51 to output registers 48 and 49 and also input register 50. Output register 48 is connected by FETs Q1 to Q4 to output ports 01 to 04, respectively. Output register 48 turns on FET Q1, Q2, Q3 or Q4 in accordance with the 4-bit data supplied from CPU 47. Any of output ports 01 to 04 outputs a low-level pulse when the FET, which is coupled to the output port, is turned on. In other words, output port 01 to 04 perform an open-output function. As is shown in FIG. 2, output ports 01 to 04 are normally open, and sequentially output low-level pulses. More precisely, port 01 first supplies a low-level pulse, port 02 then outputs a low-level pulse, port 03 outputs a low-level pulse next, and, finally, port 04 supplies a low-level pulse. In FIG. 2, TL1, TL2, TL3, and TL4 are successive periods during which the signals output from respective output ports 01 to 04 remain at the low level.

Output register 49 supplies D/A converter 52 with the digital data supplied from CPU 47. D/A converter 52 converts the digital data into analog data, (a corresponding voltage). This voltage is applied, as a reference voltage Vref, to the first input to comparator 53. The voltage applied to input port Iin of microcomputer 44 is applied to the second input of comparator 53. Comparator 53 compares the voltage applied to input port Iin, with the reference voltage Vref output by D/A converter 52, and outputs a high-level data or a low-level data in accordance with the comparison result. The data representing the comparison result is stored in input register 50. From the data stored in input register 50, CPU 47 determines which key switch has been turned on.

Figure 3:
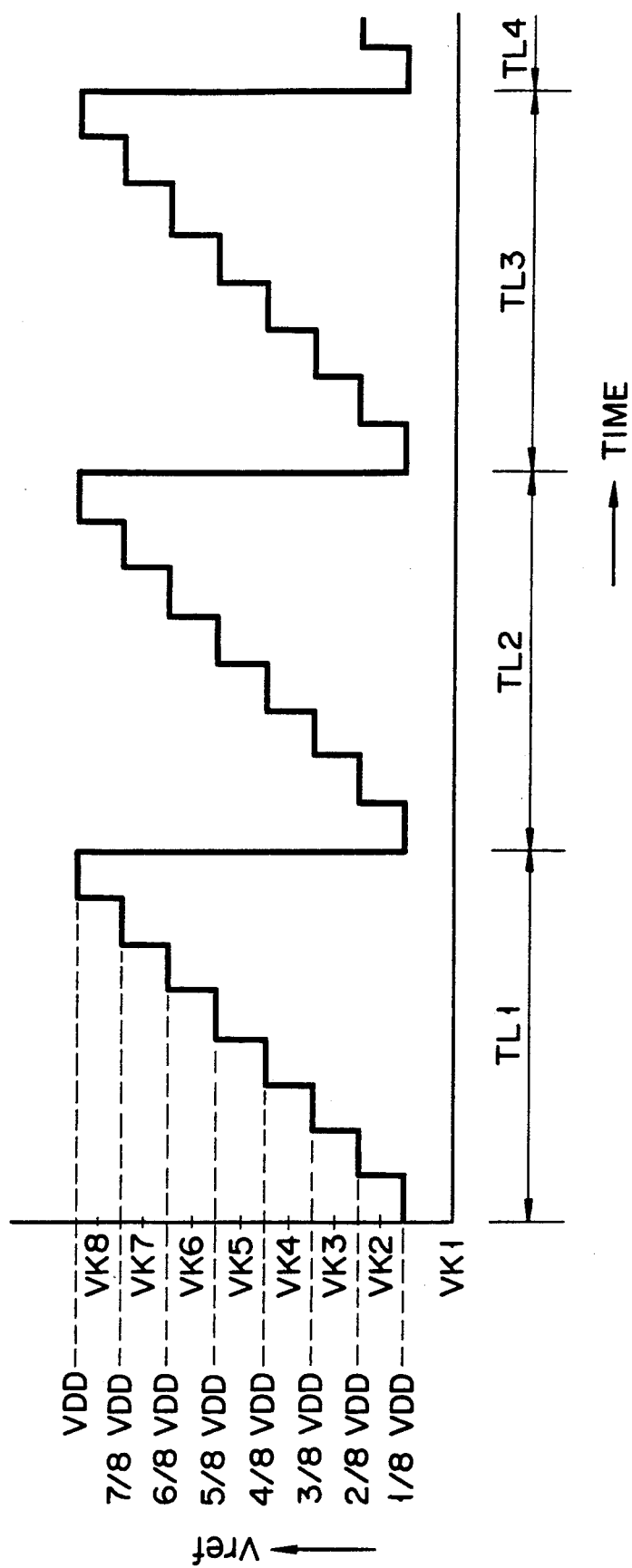
FIG. 3 is a diagram showing how the reference voltage changes with time in the apparatus shown in FIG. 1.

CPU 47 detects the voltage applied to input port Iin during periods TL1, TL2, TL3, and TL4, when the pulse signals output from output ports 01, 02, 03, and 04 are at the low level. In other words, CPU 47 increments the data stored in output register 49, thereby raising the reference voltage Vref (i.e., the output of D/A converter 49). Vref is raised incrementally, from the minimum value MIN ($\approx 0$) to the maximum value MAX ($\approx$VDD). (Alternatively, CPU 47 can lower the reference voltage Vref from maximum value MAX to the minimum value MIN.) When the reference voltage Vref rises above the voltage applied to input port Iin, the data output by comparator 53 becomes a high-level data from a low-level data, and the voltage input to microcomputer 44 can be detected. As is shown in FIG. 3, the reference voltage Vref is raised seven times and has eight different values during the period any pulse signal output by microcomputer 44 remains at the low level each time VREF is incremented by $\frac{1}{8}$ VDD. This is because each group of key switches includes eight key switches in this embodiment. (According to the invention, the number of different values which the voltage Vref can have is equal to the number of the key switches forming each group.) In FIG. 3, VK1 to VK8 are the voltages which are applied to input port Iin when one key switch of any group is operated.

Resistors R1 to R8 divide such voltage VDD input to terminal 46 between themselves and resistor R8, such that voltages VK1 to VK8 are applied to input port Iin of microcomputer 44. The resistances of resistors R1 to R8 are determined by the resolution of D/A converter 51. In the first embodiment, the resistances are given by solving the following simultaneous equations:

$$\frac{1}{8} VDD < VK2 < \frac{2}{8} VDD \quad VK2 = \frac{R1}{R1 + R8}$$

$$\frac{2}{8} VDD < VK3 < \frac{3}{8} VDD \quad VK3 = \frac{R1 + R2}{R1 + R2 + R8}$$

$$\frac{3}{8} VDD < VK4 < \frac{4}{8} VDD \quad VK4 = \frac{R1 + R2 + R3}{R1 + R2 + R3 + R8}$$

$$\frac{4}{8} VDD < VK5 < \frac{5}{8} VDD \quad VK5 =$$

$$\frac{R1 + R2 + R3 + R4}{R1 + R2 + R3 + R4 + R8}$$

$$\frac{5}{8} VDD < VK6 < \frac{6}{8} VDD \quad VK6 =$$

$$\frac{R1 + R2 + R3 + R4 + R5}{R1 + R2 + R3 + R4 + R5 + R8}$$

$$\frac{6}{8} VDD < VK7 < \frac{7}{8} VDD \quad VK7 =$$

$$\frac{R1 + R2 + R3 + R4 + R5 + R6}{R1 + R2 + R3 + R4 + R5 + R6 + R8}$$

$$\frac{7}{8} VDD < VK8 < VDD \quad VK8 =$$

$$\frac{R1 + R2 + R3 + R4 + R5 + R6 + R7}{R1 + R2 + R3 + R4 + R5 + R6 + R7 + R8}$$

Figure 4A:
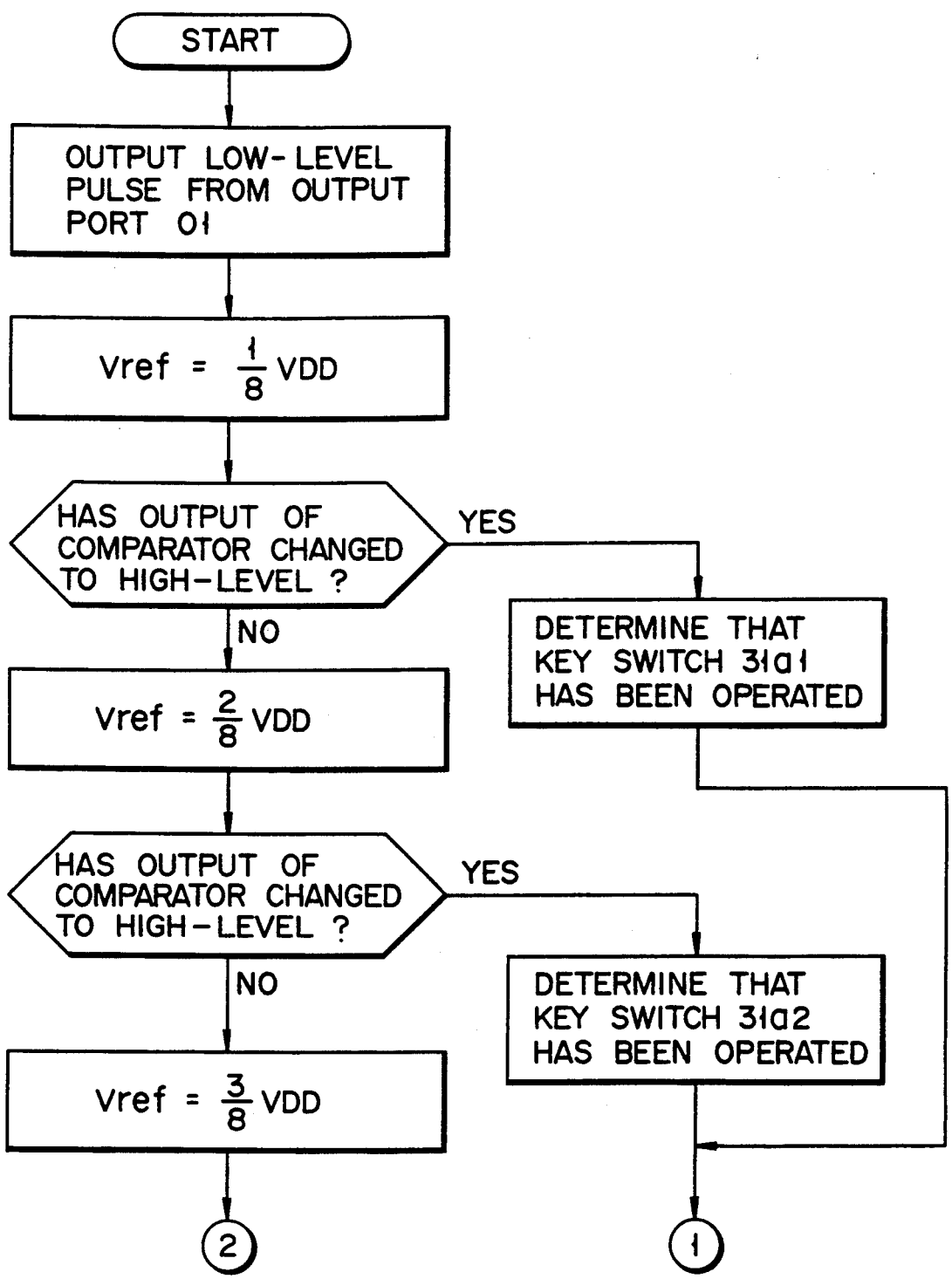
FIGS. 4A to 4C are a flow chart explaining how the CPU used in the apparatus shown in FIG. 1 operates during a period TL1.
Figure 4B:
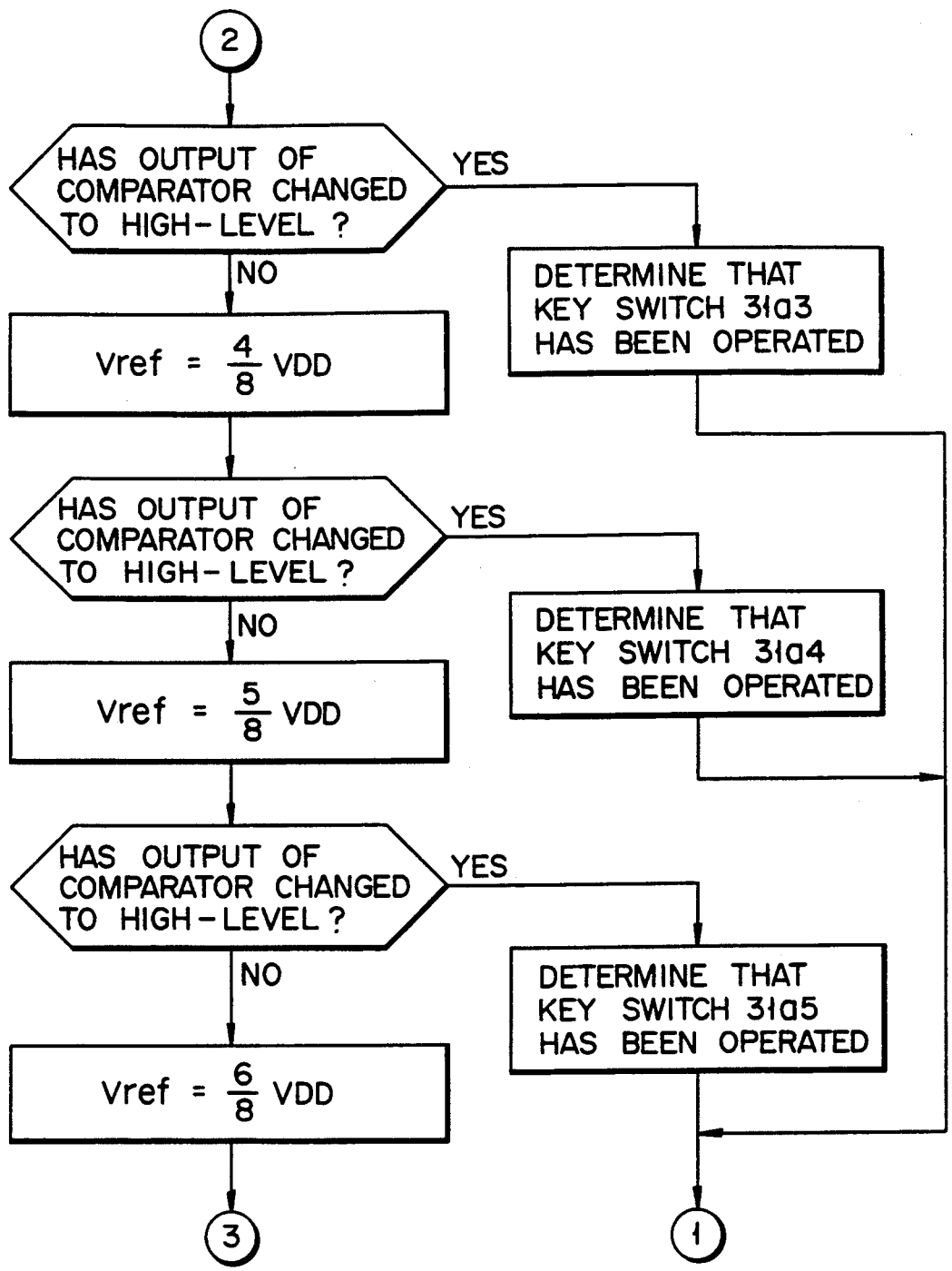
Figure 4C:
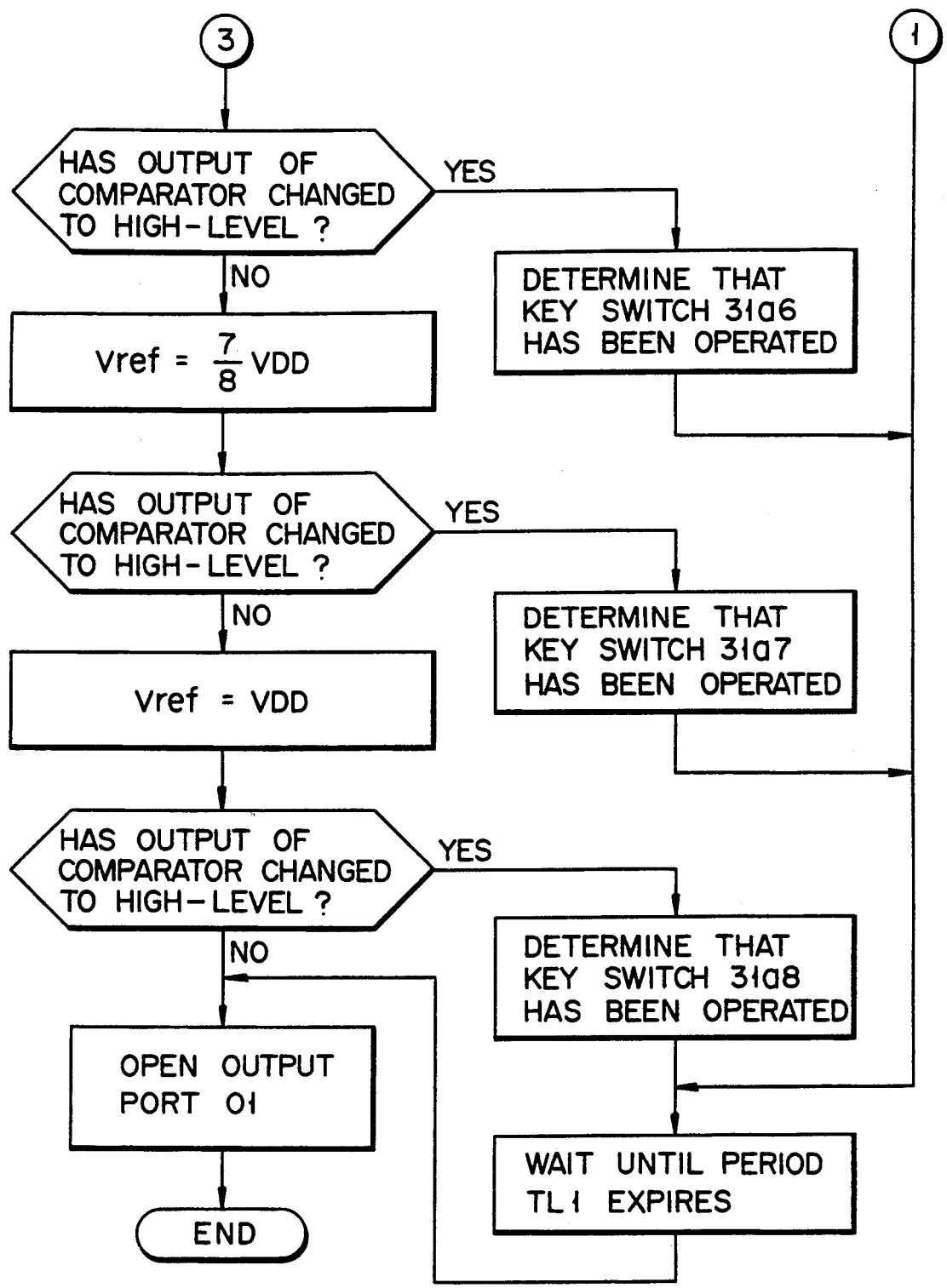

In order to determine which the key switches of the first group 31a1 to 31a8 (coupled to line 32, which in turn is connected to output port 01) has been turned on, CPU 47 detects the voltage applied to input port Iin during the period TL1. The level of the voltage appearing at Iin will correspond to the operated key switch. Hence, CPU 47 determines the level of the voltage applied to input port Iin during period TL1 and ascertains which key switch of the first group has been turned on. More specifically, if the voltage applied to input port Iin is lower than $\frac{1}{8}$ VDD, CPU 47 determines that key switch 31a1 (which is connected to line 32 of the first group) and line 36 of the second group, has been turned on; if said voltage is lower than 2/8 VDD, CPU 47 determines that key switch 31a2 (which is coupled to line 32 of the first group and line 37 of the second group) has been turned on; and so forth. And, if said voltage is lower than VDD, CPU 47 determines that key switch 31a8 (which is coupled to line 32 of the first group and line 43 of the second group) has been turned on. FIGS. 4A to 4C are a flow chart explaining how CPU 47 operates during the period TL1.

To determine which one of those key switches which are coupled to lines 33 to 35 (which in turn are connected to output ports 02 to 04) CPU 47 also detects have been turned on the level of the voltage applied to input port Iin during periods TL2 to TL4, respectively. For this purpose, CPU 47 operates in the same way as is explained by the flow chart of FIGS. 4A to 4C. More specifically, when any of key switches 31a1 to 31a8, 31b1 to 31b8, 31c1 to 31c8, and 31d1 to 31d8 is turned on, a voltage of the level identifying the operated key switch is applied to input port Iin whenever a low-level pulse is output from one of output ports 01 to 04. Thus, CPU 47 of microcomputer 44 can determine which key switch has been turned on, in accordance with the level of the voltage applied to input port Iin at the time the voltage was applied to input port Iin.

In the case of a data input apparatus of the structure similar to that shown in FIG. 1, the microcomputer must have J ports, and H resistors must be used. J and H are given as follows:

$$J = 1 + \{K/(I+1)\}$$

$$H = I + 1$$

In the above equations, K is the number of key switches used in key matrix 31, and I is the number of resistors forming serial circuit 45.

In the case of the embodiment shown in FIG. 1, K=32, and I=7. Hence, the required number J of ports, and the required number H of resistors are:

$$J = 1 + \{32/(7+1)\} = 5$$

$$H = 7 + 1 = 8.$$

Hence, it suffices for the embodiment to have only five ports and only eight resistors.

Figure 5:
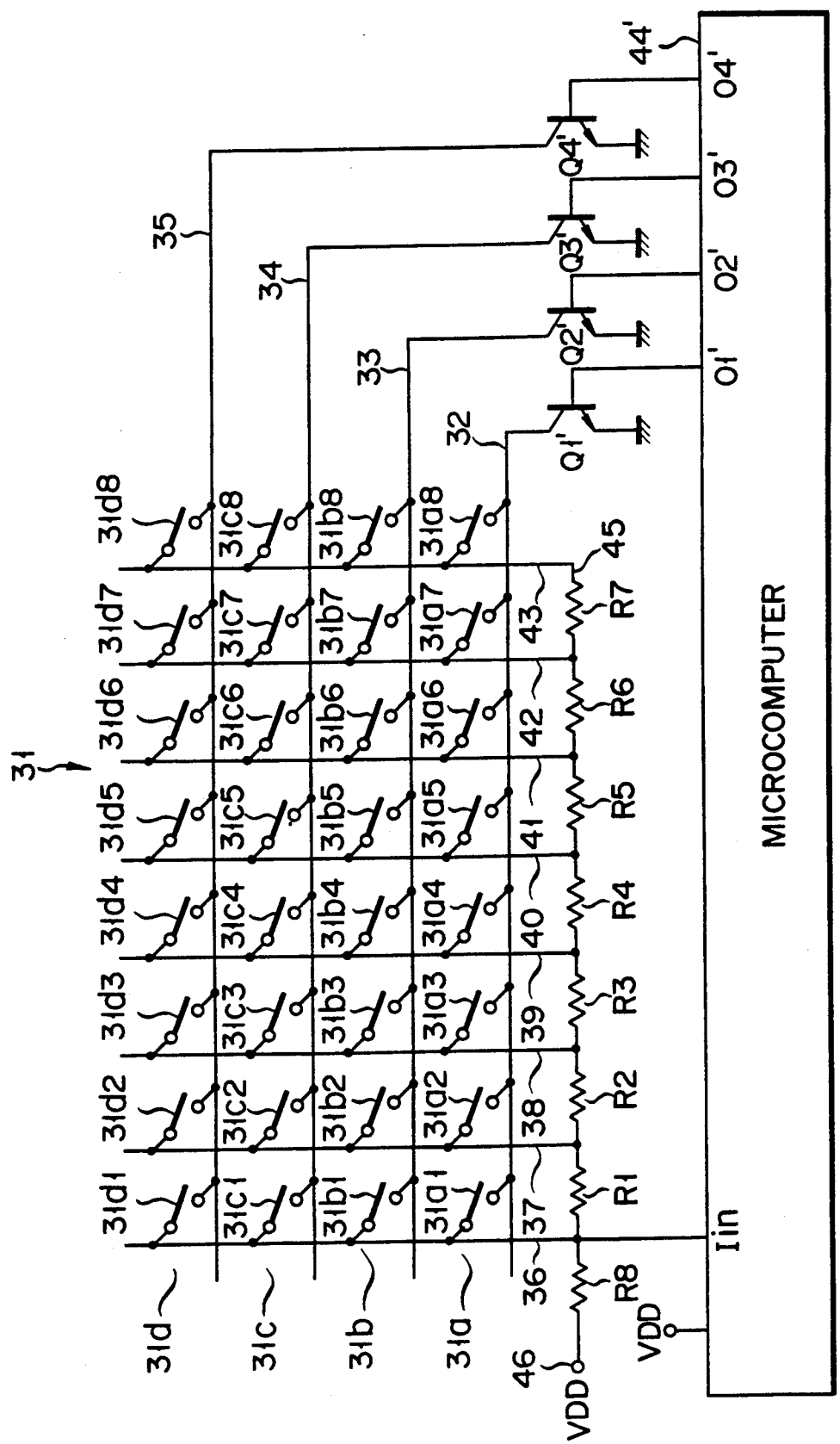
FIG. 5 is a circuit diagram showing the data input apparatus according to a second embodiment of the present invention.

FIG. 5 shows a second embodiment of the present invention, i.e., a data input apparatus having microcomputer 44' whose output ports are usually closed. The second embodiment is identical to the first embodiment, except that transistors Q1', Q2', Q3', and Q4' are provided outside, microcomputer 44', not within microcomputer 44' as in the first embodiment (FIG. 1).

In the data input apparatus shown in FIG. 5, microcomputer 44' outputs high-level pulses, sequentially via four output ports 01', 02', 03', and 04', as is shown in FIG. 6. Output ports 01', 02', 03', and 04' are coupled to the bases of NPN transistors Q1', Q2', Q3', and Q4', respectively. The emitters of these transistors are connected to the ground. The collectors of these transistors are coupled to lines 32 to 35 of the first group, respectively. Hence, lines 32, 33, 34, and 35 can be sequentially set at a low potential, usually in their open state. The data input apparatus can operate in the same way as the first embodiment (FIG. 1).

In either embodiment, when two or more key switches of the same group are operated simultaneously, that one through which the lowest voltage is applied to the input port Iin of the microcomputer is regarded as having been operated. In other words, the greatest priority is given to the key switches coupled to line 36; the second priority to those connected to line 37; the third priority to those coupled to line 38, and so forth. And the least priority to the key switches connected to line 43. Thus, it is advisable to assign high priorities to the important key switches such as the key switch for inputting a power-supply command which should be correctly input by all means.

As has been described in detail, the present invention can provide a data input apparatus which requires only a relatively small number of ports and a relatively small number of resistors even if provided with a great number of key switches. The data input apparatus according to the invention can be useful as a machine interface containing a microcomputer. Moreover, the number of the lines connecting the key matrix to the microcomputer which is located away from the matrix can be small.

What is claimed is:

1. A data input apparatus comprising:
   (a) a key switch device, including:
      a first group of lines extending parallel to one another;
      a second group of lines extending parallel to one another and intersecting with the lines of the first group;
      a plurality of key switches for connecting the lines of the first group to the lines of the second group, each of said key switches being located at a respective intersection of a line of the first group and a line of the second group;
      a serial circuit comprising a plurality of first resistors connected in series, each of said first resistors being connected in parallel between adjacent lines of the second group; and
      a second resistor, and a constant-voltage source connected through said second resistor to one end of said serial circuit at a connecting point; and
   (b) a processing apparatus, including:
      pulse-supplying means for supplying a periodic pulse to each line of said first group, the pulses being supplied to different lines at different times; and
      detector means coupled to said pulse-supplying means and to the connecting point for detecting a potential at the connecting point and, in accordance with said potential and with the times at which pulses have been supplied to the lines of said first group from said pulse supplying means, for determining which key switch has been operated.

2. The apparatus according to claim 1, wherein said pulse-supplying means includes a low-level pulse supplying means for holding the lines of said first group in a normally open condition and for supplying periodic low-level pulses to these lines, the pulses supplied to different lines at different times.

3. The apparatus according to claim 2, wherein said low-level pulse supplying means includes:
   a plurality of switching means for holding said lines of said first group in said normally open condition and for periodically connecting these lines to a ground, said switching means each connected to a respective line of said first group; and
   switch control means for causing said switching means to periodically connect each of the lines of said first group to the ground, the connecting of different lines to ground being at different times.

4. The apparatus according to claim 3, wherein said switching means, said switch control means, and said detector means are formed as a single large-scale integration circuit.

5. The apparatus according to claim 4, wherein said detector means includes:
   potential-comparison means for comparing the potential at the connecting point with a reference voltage which level incrementally changes, and for outputting a comparison result; and
   key-detecting unit for detecting, in accordance with the comparison result and the times at which said switch control means causes said switching means to connect said lines of the first group to the ground, which key switch has been operated.

6. The apparatus according to claim 5, wherein said switch control means and said detector means are formed as a single large-scale integration circuit.

7. The apparatus according to claim 1, wherein said detector means includes:
   potential-comparison means for comparing the potential at the connecting point with a reference voltage which level incrementally changes, and for outputting a comparison result; and
   key-detecting unit for detecting, in accordance with the comparison result and the times at which said switch control means causes said switching means to connect said lines of the first group to the ground, which key switch has been operated.

* * * * *